United States Patent [19]
Gilman et al.

[11] Patent Number: 6,091,046
[45] Date of Patent: *Jul. 18, 2000

[54] BONDING AND SPUTTERING TARGET BY VARIABLE POLARITY PLASMA ARC WELDING

[75] Inventors: Paul S. Gilman, Suffern, N.Y.; Raymond K. F. Lam, Park Ridge, N.J.

[73] Assignee: Praxair S. T. Technology, Inc., North Haven, Conn.

[ * ] Notice: This patent is subject to a terminal disclaimer.

[21] Appl. No.: 09/024,552

[22] Filed: Feb. 17, 1998

Related U.S. Application Data

[63] Continuation of application No. 08/618,903, Mar. 20, 1996, Pat. No. 5,783,795.

[51] Int. Cl.$^7$ .................................................. B23K 10/00
[52] U.S. Cl. .............................. 219/121.46; 219/121.45; 219/76.16
[58] Field of Search ......................... 219/121.45, 121.46, 219/121.54, 121.47, 76.16, 121.58; 204/298.12

[56] References Cited

U.S. PATENT DOCUMENTS

| | | | |
|---|---|---|---|
| 4,739,146 | 4/1988 | Lindlam et al. | 219/121.59 |
| 5,070,228 | 12/1991 | Siemers et al. | 219/121.46 |
| 5,409,590 | 4/1995 | Hurwitt et al. | 204/298.2 |
| 5,464,958 | 11/1995 | Flowers et al. | 219/121.47 |
| 5,466,905 | 11/1995 | Flowers et al. | 219/121.46 |
| 5,471,031 | 11/1995 | Dailey et al. | 219/121.46 |
| 5,556,559 | 9/1996 | Bjorkman, Jr. et al. | 219/121.51 |

OTHER PUBLICATIONS

Ian D. Harris, *Plasma Arc Welding*, American Society of Metals, Welding Handbook p. 195–199.

*Primary Examiner*—Mark Paschall
*Attorney, Agent, or Firm*—Wood, Herron & Evans, L.L.P.

[57] ABSTRACT

A reusable aluminum sputter target support tube which is bonded to a replaceable sputter target by variable polarity plasma arc welding and a method of manufacturing such reusable sputtering target assemblies.

18 Claims, 1 Drawing Sheet

BONDING AND SPUTTERING TARGET BY VARIABLE POLARITY PLASMA ARC WELDING

This application is a continuation of application Ser. No. 08/618,903, filed on Mar. 20, 1996 now U.S. Pat. No. 5,783,795.

FIELD OF THE INVENTION

This invention relates to an aluminum target having a reusable sputtering tube bonded to a replaceable sputtering target by VPPA-welding and methods of making such assemblies.

BACKGROUND OF THE INVENTION

Sputtering is widely used for the deposition of thin layers onto substrates. The process is carried out in a vacuum chamber which is filled with a chemically inert gas, ions of which bombard the target, transfer their momentum to the target material and cause particles of the material to be ejected from the target surface. Accordingly, after substantial use, the target material becomes eroded in a generally annular section of the target face, known as the target raceway.

In a conventional sputter target assembly, the target is attached to a support tube which is water-cooled to carry away the heat generated by the ion bombardment of the target. To prevent the coolant from escaping into the vacuum chamber, the connection between the target and the backing tube must be impervious to the pressure of the coolant and the vacuum. As the target surface is eroded by ion bombardment, there is increased danger of the target failing at the target raceway and allowing coolant to escape into the vacuum chamber. Therefore, sputtering targets must be replaced frequently.

Previously, aluminum targets were electron beam-welded to the support tube. The electron beam welding requires oversized targets and support tubes. The electron beam weld is an autogenous weld and therefore substantial amounts of the aluminum target and tube are melted in order to join the target to the support tube. Once the target has been welded to the tube, substantial machining is required to bring the oversized targets and tubes into the final shape. The melting of the aluminum during the E-beam welding and the subsequent machining of the target and support tube makes the fabrication of an entirely new target assembly, including both the target and the tube, necessary. Thus, each new target includes the cost of fabricating the support tube and of the machining.

Accordingly, it is an object of the invention to provide a reusable sputtering target support tube and an inexpensive method of reusing the support tube that does not require the post-bonding machining required when the prior art electron beam welding method is used.

SUMMARY OF THE INVENTION

This invention is directed to an improved sputter target and support tube assembly and a method for making such an assembly. The assembly includes a target grade aluminum sputter target which is bonded to a commercial grade aluminum support tube by variable polarity plasma arc welding (VPPA).

The present invention allows direct replacement of sputtering targets upon re-used sputtering target tubes. The VPPA process allows welding of the target and support tubes at final dimensions, eliminating the machining of the oversized welded target assemblies of the prior art.

DETAILED DESCRIPTION OF THE INVENTION

Figure 1:
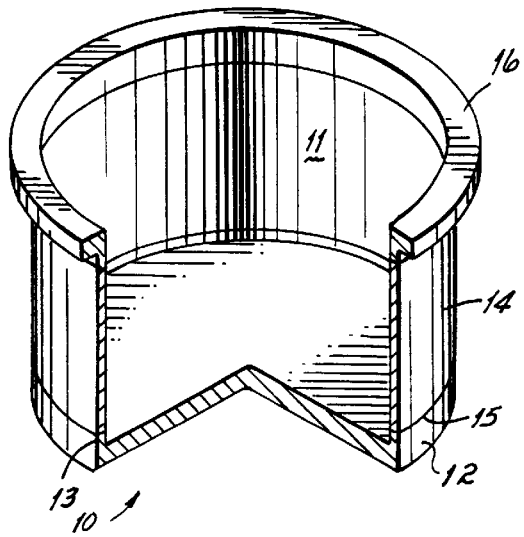
FIG. 1 is an isometric view of the assembled sputtering target, partially cut away.

Plasma arc welding is a gas-shielded arc welding process where the coalescence of metals is achieved by heat transfer from an arc created between an electrode and the workpiece. The arc is a highly collimated arc column which ionizes a portion of the plasma gas. Plasma arc welding is described in the article by Ian D. Harris, "Plasma Arc Welding", *The American Society of Metals Welding Handbook*, pp. 195–199, 1995, the entire disclosure of which is incorporated herein by reference.

Plasma arc welding torches 18 are commercially available and include a tungsten electrode 20 held in a collett within the torch body. The electrode 20 is set inside a water-cooled plenum chamber 22 and the plasma gas is supplied to this chamber. A copper alloy nozzle 26 forms the front of this chamber and contains a nozzle orifice 27 to constrict the plasma arc 28. A shielding gas shroud 24, such as helium or argon, covers the front edge of the welding torch and surrounds the constricted nozzle 26. A power source (not shown) is connected to the electrode 20 to form one pole of the circuit for VPPA. The target assembly 10 is the second pole in the circuit. The arc 28 is generated between the target assembly 10 and electrode 20 by the plasma gas. The shield gas protects the pool of molten metal from atmospheric contamination while it cools.

Figure 3:
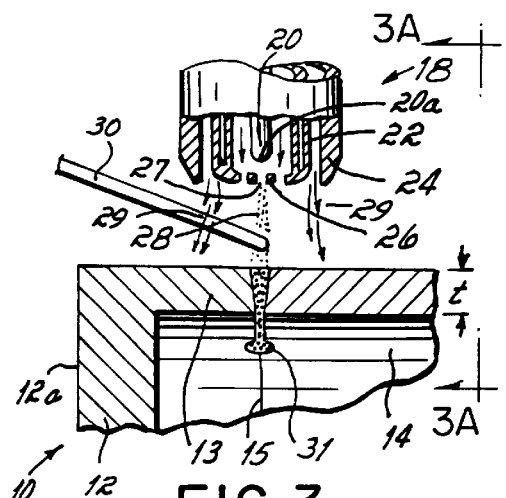
FIG. 3 is a schematic view, partially cut away, of the plasma welder, filler tube and target assembly.

Sputter target assembly 10 includes a flanged ring 16 for mounting to the base of the vacuum chamber in a sputtering device. The ring 16 forms a tight seal which prevents the flow of cooling liquid from the interior 11 of the sputter target assembly 10 to the sputter chamber which is evacuated. The flanged ring 16 is mounted to a support tube 14 to provide an interior chamber 11 for containing the cooling fluid required to carry away heat generated away by the impact of ions on the surface 12a of target 12. The target 12 includes a lip 13 having a thickness t between 0.1 and 0.4 inches and preferably 0.25 inches. Support tube 14 has a constant thickness t, measured as shown in FIG. 3, approximately equal to that of the target lip 13, i.e. 0.1–0.4 inches, and preferably 0.25 inches. The flanged ring 16 may be welded to the tube 14 or may be formed as a unitary forging.

Target assemblies 10 having an outer diameter D of between 8–12 inches and a lip 13 thickness t of 0.1–0.4 inches have been joined to support tubes 14 by VPPA welding. The electrode used in the present invention is a tungsten/2% thorium electrode, having a ⅛ inch diameter and a balled end 20a. The plasma nozzle 27 includes a ⅛ inch round orifice 27. The plasma gas 28 used is argon while the shielding gas 29 is, preferably, helium. A filler wire of 2319 aluminum alloy wire 30 having a diameter of 1/16 of an inch was used. The target lip 13 and support tube 14 were wiped clean with alcohol and scraped on their respective inner and outer marginal surfaces and butt edges. The target lip 13, butt edge 13a, and support tube butt edge 14a are then aligned and brought into contact with each other so that the target lip and the support tube form a butt joint 15.

Figure 3A:
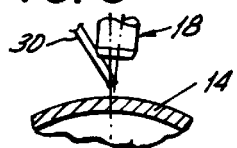
FIG. 3A is a cross sectional view of FIG. 3 taken along Line 3A.
Figure 2:
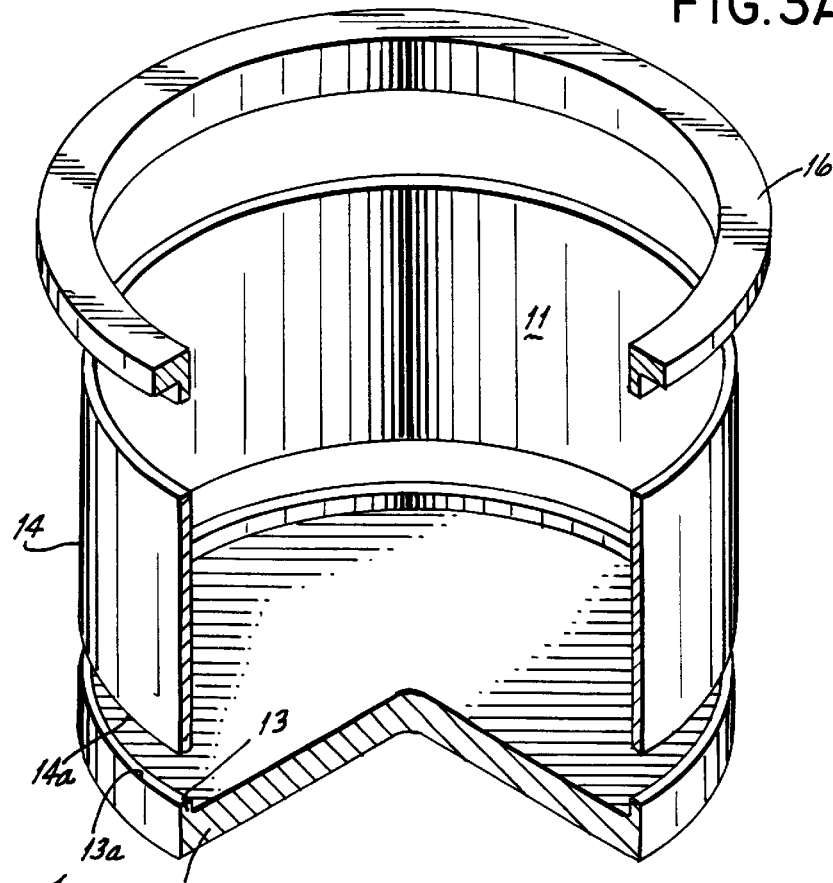
FIG. 2 is an exploded isometric view, partially cut away, of the sputter target, support tube and support base.

The welding process is performed by variable polarity plasma arc welding. The initial weld is done in keyhole mode, where the arc fully penetrates the workpiece to form a nominally concentric hole through the thickness of the workpiece. The welding torch is aligned with an approximately ¼ inch diameter hole 31 which is drilled at the butt joint 15 between the target lip edge 13a and support tube edge 14a. As shown in FIG. 3A, the torch is angled at approximately 4 degrees form perpendicular to the support tube surface. The shield and plasma gas flow and current are increased and the filler wire 30 is placed in the stream of plasma gas 28. The operating parameters in the keyhole mode are listed in Table 1 below. Once the current, and shield and plasma gas flows are up to desired values the workpiece is rotated at between 20 and 140 degrees per minute. In keyhole mode the plasma arc melts a nominally concentric hole through the support tube 14 and the target lip 13 at the butt joint 15. After the arc passes, the molten weld metal and metal from the filler wire flows around the arc and resolidifies behind the keyhole as the torch traverses the workpiece.

After the initial bonding in keyhole mode, a subsequent pass is made in cover mode to fill any voids in the wall and to improve surface finish. The operating parameters for the cover/mode are also set forth in Table 1. The cover pass is performed at lower welding current and higher filler wire feed rate. The arc does not penetrate the wall of the target assembly 10 but rather melts the surface metal and the filler wire to provide material to fill any voids.

The following table includes parameters which may be used in fabricating the target of the present invention.

TABLE 1

| PARAMETERS | KEYHOLE MODE | COVER MODE |
|---|---|---|
| Tube outer diameter, D, inches | 8–12 | 8–12 |
| Thickness, t, inches | 0.1–0.4 | 0.1–0.4 |
| Welding voltage, volts (AC) | 5–30 | 5–30 |
| Welding current, amperes | 20–180 | 20–150 |
| Plasma Ar gas flow, cubic feet/hour | 2–7 | 2–7 |
| Plasma gas pressure, inches of water | 5–30 | 5–30 |
| Filler wire feed, inches/minute | 3–50 | 3–60 |
| Shielding gas flow, cubic feet/hour | 10–90 | 10–90 |
| Welding speed, degrees/minute | 20–140 | 20–140 |

EXAMPLE

A sputtering target of target grade aluminum and a support tube of commercial grade aluminum were fabricating having an outer diameter D of 11.65 inches, the wall thickness t of the support tube 14 and target lip 13 was 0.25 inches. The target 12 was disposed in a vertical plane with the axis of the tube 14 disposed horizontally, as shown in FIG. 3. A 0.25 inch diameter hole 31 was drilled in a radial direction relative to the tube at the joint 15 between the target lip 13 and the support tube 14. A variable polarity plasma arc welding torch 18 having a tungsten/2% thorium oxide electrode 20 and a plasma tip 26 including a ⅛ inch round orifice 27 were positioned at 4° from vertical and aligned with the hole. The welding voltage was ramped up to 27.7 volts AC with a current of 163.6 amps. The argon plasma gas 28 flow was increased to 6.0 cubic feet per hour at a pressure of 28.7 inches of water and the helium shield gas 29 flow was increased to 80 cubic feet per hour. After the current was increased to 163.6 amps and the gas flow rates were increased, the target assembly 10 was rotated about the longitudinal axis of the tube 14 at a rate of 130° per minute. A $\frac{1}{16}$ inch diameter 2319 aluminum alloy filler wire 30 was fed into the plasma at 40.2 inches per minute. Once the target assembly 10 made an entire 360° rotation, to bond the entire periphery of the assembly and fill the pre-drilled hole, the current and voltage was reduced to zero and the shield gas flow continues until the metal solidifies.

A second, cover pass was performed to fill voids and improve surface finish. For the cover pass, the welding voltage was decreased from 27.7 to 25.5 volts and amperage decreased from 163.6 to 144 amps. The argon plasma gas flow was reduced from 6.0 to 2.0 cubic feet per minute, while the filler wire feed rate was increased from 40.2 inches per minute to 50.5 inches per minute. The plasma gas pressure was substantially decreased from 28.7 to 5.6 inches of water and the shielding gas flow of 80 cubic feet per hour and the welding speed of 130° per minute remained constant by rotation of the tube 14 about its axis at a constant angular rate of 130° per minute.

It is to be understood that various changes and modifications may be made to the preferred embodiment discussed above without departing from the scope of the invention, which is defined by the following claims and equivalents thereof.

What is claimed is:

1. A method of fabricating a sputtering target assembly, having a replaceable target surface, comprising the steps of:
   aligning and contacting the periphery of a target grade aluminum sputtering target with an end of a reusable aluminum tube to form a butt joint; and
   joining said target periphery and said tube end by plasma arc welding to form a vacuum tight welded joint therebetween, whereby said reusable tube may be removed from said sputtering target and joined to a new sputtering target.

2. The method of claim 1, wherein the plasma arc welding is variable polarity plasma arc welding.

3. The method of claim 2, wherein the joining step is performed with a welding voltage in the range of about 5 to 30 volts.

4. The method of claim 3, wherein the welding voltage is approximately 27 volts AC.

5. The method of claim 2, wherein the joining step is performed with a welding current in the range of 20–180 amperes.

6. The method of claim 5, wherein the welding current is approximately 163 amperes.

7. The method of claim 2, wherein the joining step is performed with an aluminum filler wire.

8. The method of claim 2 further comprising the step of finishing the exterior surface of the welded joint of the joined target and tube by plasma arc welding over the exterior surface of the welded joint to form a smooth surface.

9. The method of claim 8, wherein the finishing step is performed with a welding voltage in the range of about 5 to 30 volts AC.

10. The method of claim 9, wherein the welding voltage is approximately 25 volts AC.

11. The method of claim 8, wherein the finishing step is performed with a welding current in the range of 20–150 amperes.

12. The method of claim 11, wherein the welding current is approximately 144 amperes.

13. The method of claim 8, wherein the finishing step is performed with an aluminum filler wire.

14. The method of claim 1, further comprising the step of drilling a hole at the butt joint of the target and the tube, prior to the joining step.

15. The method of claim 1 further comprising the step of removing a used target from the tube, prior to the aligning step.

16. The method of claim 1 further comprising the step of surface finishing the exterior surface of the welded joint to remove excess material.

17. A recyclable sputtering target assembly comprising:
   a target grade aluminum sputtering target;
   a commercial grade aluminum sputtering target support tube having a first and second end;
   a vacuum proof weld seam between said sputtering target and the first end of said tube, formed by variable polarity plasma arc welding.

18. The recyclable sputtering target of claim 17 further comprising:
   a flange positioned on the second end of said tube opposite said target.

* * * * *